United States Patent
Yun et al.

(10) Patent No.: US 10,564,190 B2
(45) Date of Patent: Feb. 18, 2020

(54) CHARGE PLATE MONITOR AND OPERATING METHOD THEREOF

(71) Applicant: DONG IL TECHNOLOGY LTD., Gyeonggi-do (KR)

(72) Inventors: Joo Hun Yun, Gyeonggi-do (KR); Tae Hoon Moon, Gyeonggi-do (KR); Hyeon Wook Choi, Gyeonggi-do (KR)

(73) Assignee: DONG IL TECHNOLOGY LTD, Gyeonggi-do (KR)

( * ) Notice: Subject to any disclaimer, the term of this patent is extended or adjusted under 35 U.S.C. 154(b) by 253 days.

(21) Appl. No.: 15/550,977

(22) PCT Filed: Jan. 4, 2016

(86) PCT No.: PCT/KR2016/000011
§ 371 (c)(1),
(2) Date: Aug. 14, 2017

(87) PCT Pub. No.: WO2016/133282
PCT Pub. Date: Aug. 25, 2016

(65) Prior Publication Data
US 2018/0031615 A1  Feb. 1, 2018

(30) Foreign Application Priority Data
Feb. 17, 2015 (KR) .................. 10-2015-0023803

(51) Int. Cl.
*H01H 47/00* (2006.01)
*G01R 19/165* (2006.01)
*H01H 47/22* (2006.01)

(52) U.S. Cl.
CPC ......... *G01R 19/1659* (2013.01); *H01H 47/22* (2013.01)

(58) Field of Classification Search
None
See application file for complete search history.

(56) References Cited

U.S. PATENT DOCUMENTS

| | | | | |
|---|---|---|---|---|
| 5,016,136 A | * | 5/1991 | Corris | G01R 29/24 361/220 |
| 5,432,454 A | * | 7/1995 | Durkin | H05F 3/04 264/484 |

(Continued)

FOREIGN PATENT DOCUMENTS

| | | |
|---|---|---|
| JP | 2001124812 A | 5/2001 |
| JP | 2005077348 A | 3/2005 |

(Continued)

OTHER PUBLICATIONS

International Search Report for PCT/KR2016/000011 dated May 11, 2016.

(Continued)

*Primary Examiner* — Stephen W Jackson
(74) *Attorney, Agent, or Firm* — Millen, White, Zelano & Branigan, PC; Ryan Pool

(57) ABSTRACT

Disclosed is a charge plate monitor for eliminating a stray capacitor in a relay switch by using a voltage feedback method, and an operation method thereof. The charge plate monitor includes: a measurement plate unit including a conductive plate, a ground surface, and an insulator provided between the conductive plate and the ground surface; a noncontact electrometer provided between the conductive plate and the ground surface of the measurement plate unit and detecting an electrical potential of the conductive plate; a measurement unit reading or passing the electrical potential of the conductive plate detected by the noncontact electrometer; and a voltage feedback circuit unit that feeds the electrical potential of the conductive plate passed by the measurement unit back, and applying the electrical potential to a terminal of a relay switch terminal.

4 Claims, 3 Drawing Sheets

(56) References Cited

U.S. PATENT DOCUMENTS 6,826,030 B2 11/2004 Gorczyca et al.
2004/0057190 A1 3/2004 Gorczyca et al.

FOREIGN PATENT DOCUMENTS

JP 2008112707 A 5/2008
KR 20040025856 A 3/2004
KR 20120049780 A 5/2012

OTHER PUBLICATIONS

English Abstract of JP2008112707, Publication Date: May 15, 2008.
English Abstract of JP2005077348, Publication Date: Mar. 24, 2005.
English Abstract of JP2001124812, Publication Date: May 11, 2012.
English Abstract of KR20120049780, Publication Date: May 17, 2012.

* cited by examiner

CHARGE PLATE MONITOR AND OPERATING METHOD THEREOF

TECHNICAL FIELD

The technical field of the present invention relates to a charge plate monitor and an operation method thereof. More particularly, the present invention relates to a charge plate monitor capable of eliminating a stray capacitor in a relay switch using a voltage feedback method, and an operation method thereof.

BACKGROUND ART

A charge plate monitor includes a measuring instrument main body, a display device composed of a seven-segment display or a liquid crystal display, a measurement plate connected to the measuring instrument main body, a bar type ionizer which is a subject to be evaluated for performance, and a plurality of emitters (discharge electrodes) arranged in a longitudinal direction of the ionizer. The measuring instrument main body includes a high voltage power supply or an electro static voltmeter, an electric field meter, a timer, etc. The measuring instrument main body has a primary function of measuring a surface potential of the measurement plate, and also measures a static elimination performance and an ion balance performance of the ionizer. The measurement plate is structured such that two conductive plates having a size of 150 mm in each side are spaced from each other with a gap of 6 to 20 mm therebetween and combined with each other. The measurement plate has an overall capacity of about 20 pF.

First, to evaluate the static elimination performance of the ionizer, a high voltage of, for example, +1000 V or −1000 V needs to be applied to the measuring instrument main body for electrical charging, thereby causing ions generated by the ionizer to reach the measurement plate. In this state, charges in the measurement plate are neutralized by negative ions. A time taken for a voltage to drop from +1000 V to +100 V, or from −1000 V to −100 V (attributable to neutralization by positive ions) is measured by the measuring instrument main body. The shorter the time, the larger amount of ions the ionizer generates. Therefore, when the time is short, it is considered that a static elimination performance is high. There are various types of measurement plates classified according to voltages, i.e. from ±1000 V to ±5000 V, applied thereto. A mode in which this measurement operation is performed is called attenuation measurement mode.

Second, to evaluate an ion balance performance, the measurement plate is grounded to a voltage of 0 V. This causes positive and negative ions generated by the ionizer to reach the measurement plate. In this case, when the amount of positive ions and the amount of negative ions generated by the ionizer become equal to each other, the electrical potential of the measurement plate becomes stable at about a voltage of 0 V. At this point, the magnitude and polarity of the electrical potential are measured by the measuring instrument main body to evaluate the ion balance performance of the ionizer. A mode in which this measurement operation is performed is called ion balance measurement mode.

There is a trend that a substrate for a liquid crystal display or a plasma display, from which charges need to be removed, is increased. Accordingly, the length of a bar type ionizer correspondingly increases. When evaluating performance of a long-size ionizer by using a single charge plate monitor, it is necessary to measure the performance while moving the single charge plate monitor in a lengthwise direction of the ionizer because a plurality of emitters is arranged over a range of the full length of the ionizer in the lengthwise direction. For this reason, it takes much labor and time to evaluate performance of even a single ionizer. To solve this problem, a plurality of charge plate monitors may be used. In this case, it is possible to evaluate the performance of a long-size ionizer by performing a measurement operation only one time. However, this method incurs high costs because the charge plate monitors are expensive.

Japanese Patent Application Publication No. 10-2008-519260 (published as of Jun. 5, 2008.06.05) discloses an ion balance monitor in which a measurement plate is divided into a plurality of sections and the sections are applied with different bias voltages, thereby simultaneously measuring an ion balance performance and an ion generation rate. According to this disclosure, the measurement plate is divided into a plurality of sections, and the alternate sections are applied with a plus bias voltage and a minus bias voltage, respectively. The measurement plate measures an ion balance state or an ion generation rate of positive and negative ions generated by an ionizer. However, the disclosed technology cannot solve the problems of a laborious measurement operation and a long measurement time attributable to the long length of the ionizer.

Korean Patent Application Publication No. 10-2012-0049780 (published as of May 17, 2012) discloses a charge plate monitor for measuring a static elimination performance or an ion balance performance (performance of maintaining balance between positive ions and negative ions) to evaluate the performance of an ionizer. The charge plate monitor detects positive and negative ions generated by the ionizer using a measurement plate, and evaluates balance between positive and negative ions. In the charge plate monitor, a single measuring instrument main body is provided with two functions: reducing a time taken for a preliminarily applied electrical potential of the measurement plate to be attenuated to a predetermined electrical potential by generated ions; and measuring an ion balance performance on the basis of the electrical potential of the measurement plate. According to this technology, a plurality of measurement plates is prepared. The number of measurement plates used is determined depending on the length of an ionizer to be evaluated for performance thereof. The measurement plates are connected to the measuring instrument main body in series or in parallel. According to the disclosed technology, a number of measurement plates, the number of which corresponds to the number of required tables, are connected to a single measuring instrument main body in series or in parallel. Therefore, it is possible to evaluate a static elimination performance and an ion balance performance of a long ionizer using only a single charge plate monitor, thereby resulting in reduction in time and costs for performance evaluation of the ionizer. In addition, this technology can be applied to various ionizers having different lengths by changing the number of tables of the measurement plates connected to the measuring instrument main body in accordance with the length of the ionizer.

As illustrated in FIG. 1, the measurement plate of the conventional charge plate monitor includes a conductive plate, a floating ground that is separated from an earth ground, and an insulator provided between the conductive plate and the floating ground.

For measurement, an equivalent capacitance (for example, capacitance of 20 pF±2 pF) needs to be formed in the measurement plate by using a voltage follower separating the conductive plate and the floating ground from each other. In the case of contact type measurement, since it is necessary to apply a high voltage of 1000 V to the floating ground while following (tracing) an input voltage that is input to the conductive plate, a high voltage cable is required. Therefore, this case has a disadvantage that selection of a high voltage cable is critically important. In the case of noncontact type measurement, when a high voltage is applied, mechanical connection and subsequent perfect separation need to be performed. This case has a disadvantage that a mechanical device influencing the weight and size of the conventional charge plate monitor needs to be used.

DISCLOSURE

Technical Problem

The present invention is provided to solve the problems described above and is intended to provide a charge plate monitor capable of eliminating a stray capacitor in a relay switch using a voltage feedback method, and an operation method thereof.

Technical Solution

In order to accomplish the object of the present invention, according to one embodiment, there is provided a charge plate monitor including: a measurement plate unit including a conductive plate, a ground surface, and an insulator provided between the conductive plate and the ground surface; a noncontact electrometer installed between the conductive plate and the ground surface of the measurement plate unit, and detecting an electrical potential of the conductive plate; a measurement unit reading or passing the electrical potential of the conductive plate detected by the noncontact electrometer; and a voltage feedback circuit unit feeding the electrical potential of the conductive plate, which is passed by the measurement unit, back, and applying the electrical potential of the conductive plate to a terminal of a relay switch terminal.

In the embodiment, the charge plate monitor further includes a high voltage power supply (HVPS) having a power application portion that is combined with the measurement plate unit.

In the embodiment, the noncontact electrometer may measure an electrical potential of the conductive plate when the HVPS applies a high voltage to the measurement plate unit via the relay switch.

In the embodiment, the voltage feedback circuit unit makes an electric current zero (0) by applying the electrical potential of the conductive plate, which is detected by the noncontact electrometer, to the terminal of the relay switch, thereby preventing the measurement plate unit from being influenced by a stray capacitor even after the relay switch is switched off.

In the embodiment, in decay mode, the measurement unit generates an HVPS on signal and a relay switch on signal, applies the HVPS on signal and the relay switch on signal to the HVPS and the relay switch, respectively.

In the embodiment, the HVPS supplies a voltage to the relay switch in accordance with the HVPS on signal applied by the measurement unit.

In the embodiment, the relay switch is switched on in accordance with the relay switch on signal applied by the measurement unit, and charges the conductive plate to a voltage equal to or higher than a predetermined value using a voltage supplied by the HVPS.

In the embodiment, the noncontact electrometer applies the electrical potential of the conductive plate, which is detected when the voltage supplied by the HVPS is equal to or higher than a predetermined value, to the measurement unit.

In the embodiment, the measurement unit generates a relay switch off signal when the voltage supplied by the HVPS is equal to or higher than a predetermined value, generates an HVPS off signal when the voltage supplied by the HVPS is equal to or lower than a predetermined value, and transmits the relay switch off signal and the HVPS off signal to the relay switch and the HVPS, respectively.

In the embodiment, the HVPS switches off a voltage supply to the relay switch in accordance with the HVPS off signal applied by the measurement unit.

In the embodiment, the relay switch is switched off in accordance with the relay switch off signal applied by the measurement unit, thereby switching off the voltage supply from the HVPS.

In the embodiment, the measurement unit reads a value of the electrical potential of the conductive plate detected by the noncontact electrometer when the voltage supplied by the HVPS is equal to or higher than a predetermined value, and feeds the read value of the electrical potential of the conductive plate back through the voltage feedback circuit unit, thereby following the voltage supplied by the HVPS.

In the embodiment, the measurement unit traces the voltage supplied by the HVPS by feeding the value of the electrical potential of the conductive plate back through the voltage feedback circuit unit, and thus equalizes potentials at respective ends of the relay switch.

According to another embodiment, there is provided a method of operating a charge plate monitor, the method including: detecting an electrical potential of a conductive plate, using a noncontact electrometer provided between the conductive plate and a ground surface of a measurement plate unit; reading or passing the electrical potential of the conductive plate, which is detected by the noncontact electrometer, using a measurement unit; and feeding the electrical potential of the conductive plate, which is passed by the measurement unit, back and applying the electrical potential of the conductive plate, which is passed by the measurement unit, to a terminal of a relay switch.

Advantageous Effects

The present invention has advantages described below. The charge plate monitor and operation method thereof, in which a plate assembly is provided with a high voltage generator and a stray capacitor in a relay switch is eliminated through a voltage feedback method, are provided. For this reason, it becomes unnecessary to use a high voltage cable. In addition, it is possible to maintain an equivalent capacitance (for example, capacitance of 20 pF±2 pF) by minimizing a stray capacitance. Therefore, it is possible to prevent the stray capacitance from influencing measurements such as a static decay time when switching on and off supply of a high voltage using a relay switch, thereby precisely measuring performance of an ionizer. In addition, according to the present invention, it is possible to minimize influence of a stray capacitance in a charge plate monitor for measuring performance of an industrial ionizer. Therefore, the present invention has an advantage of precisely measuring a decay time of an industrial ionizer.

According to the present invention, a high voltage application portion is combined with a measurement plate unit. Therefore, an overall size of a measuring instrument main body (controller) can be reduced and the structure of the measuring instrument main body (controller) can be simplified. Furthermore, since the measuring instrument main body (controller) and the measurement plate unit are connected via a signal line, it is easy to choose a cable.

According to the present invention, when applying a high voltage to the measurement plate unit of the charge plate monitor, a voltage feedback circuit unit is used. With the use of the voltage feedback circuit unit, the electrical potential of the conductive plate is detected by the noncontact electrometer and the same voltage is applied to the terminal of the relay switch, so an electric current becomes zero. The charge plate monitor is hardly influenced by a stray capacitor even after the relay switch is switched off. In addition, it is possible to maintain an equivalent capacitance (for example, capacitance of 20 pF±2 pF) as the plate capacitance, thereby having an advantage of eliminating influence on measurements such as a natural discharge time.

MODE FOR INVENTION

Figure 1:
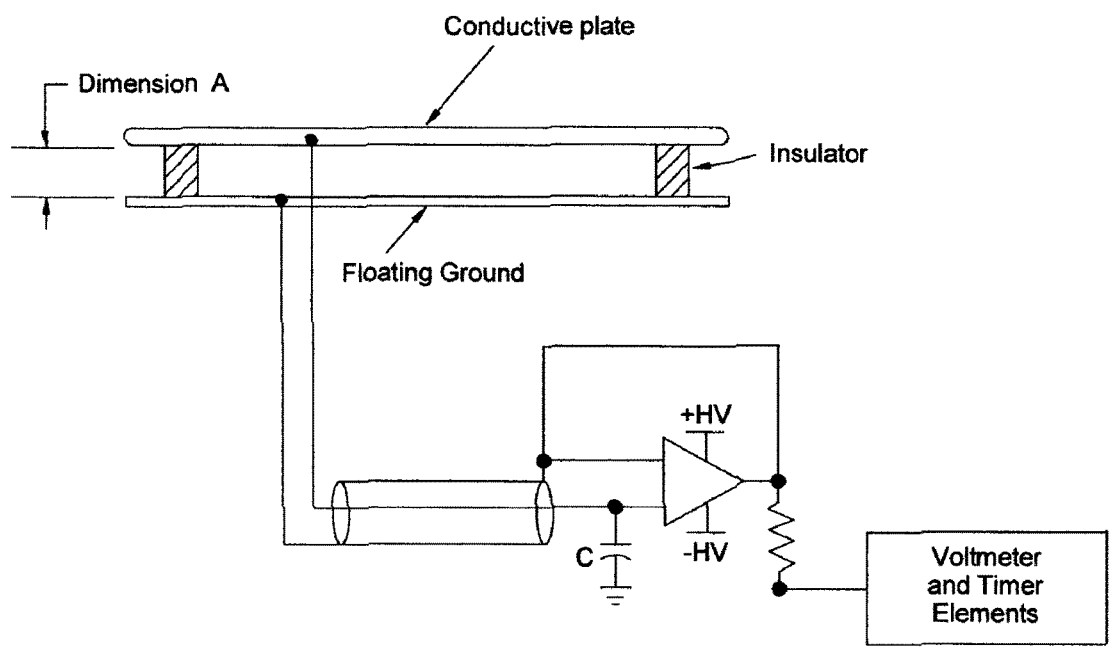
FIG. 1 is a diagram illustrating a measurement plate of a conventional charge plate monitor.

Hereinafter, exemplary embodiments of the present invention will be described in detail with reference to the accompanying drawings in a manner that those ordinarily skilled in the art can easily utilize the present invention. Specific structural and functional details disclosed herein are merely representative for purposes of describing example embodiments of the present invention. This invention may, however, be embodied in many alternate forms and should not be construed as limited to only the embodiments set forth herein. That is, the example embodiments may be modified in many different forms, and the scope of the present invention should be construed to include equivalents that can implement technical spirit of the present invention. In addition, it does not mean that a specific embodiment includes all or only the objects and advantages suggested by the present invention. Accordingly, the scope of the present invention should not be construed to be limited by the specific embodiment.

The terms used herein should be construed to have the following meanings.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element. It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between,", "adjacent to", or "directly adjacent to" should be construed in the same way.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A charge plate monitor and an operation method thereof according to one embodiment of the present invention will be described below with reference to the accompanying drawings.

Figure 2:
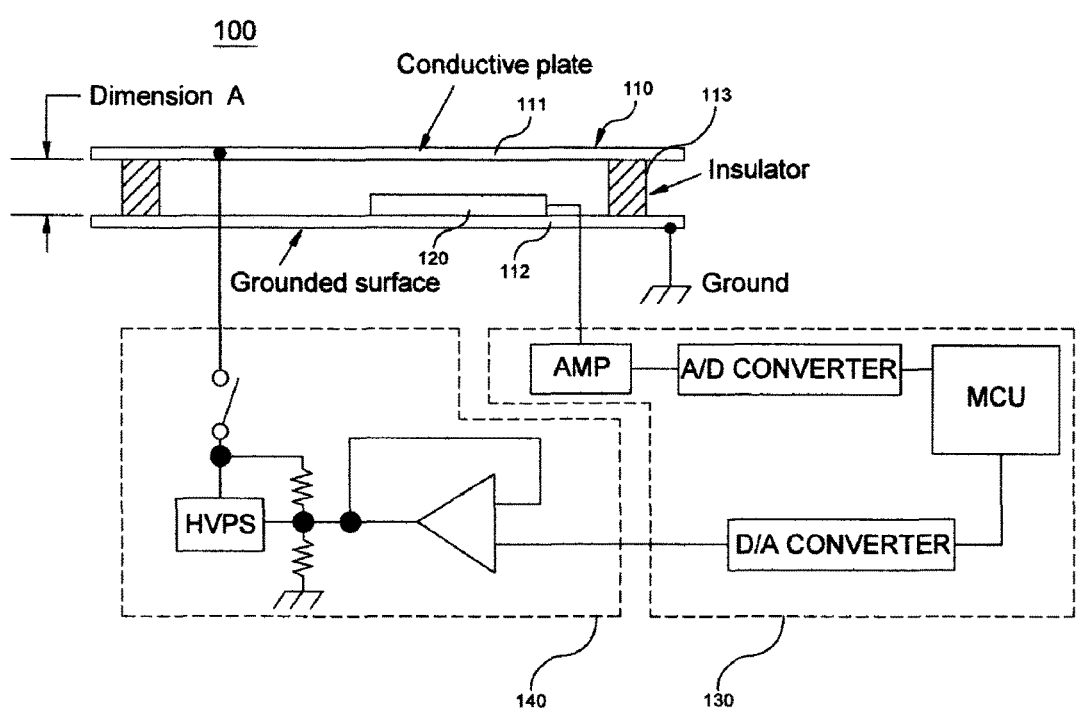
FIG. 2 is a diagram illustrating a charge plate monitor according to one embodiment of the present invention.

FIG. 2 is a diagram illustrating a charge plate monitor according to one embodiment of the present invention.

With reference to FIG. 2, according to one embodiment of the present invention, a charge plate monitor 100 includes a measurement plate unit 110, a noncontact electrometer 120, a measurement unit 130, and a voltage feedback circuit unit 140.

The measurement plate unit 110 is a conductive plate. The measurement plate unit 110 includes a conductive plate 111 and a ground surface 112 that are conductive plates, and an insulator 113 provided between the conductive plate 111 and the grounded surface. The noncontact electrometer 120 is installed inside (i.e., between the conductive plate 111 and the ground surface 112).

In the embodiment, the conductive plate 111 may have a size of 10 to 25 cm×10 to 25 cm (preferably, 15 cm (6")×15 cm (6")).

The noncontact electrometer 120 is installed inside the measurement plate unit 110 (i.e., between the conductive plate 111 and the ground surface 112), detects a electrical potential of the measurement plate unit 110 (conductive plate 111), and applies the detected electrical potential of the conductive plate to the measurement unit 130.

The measurement unit 130 is a combination of a field meter and a digital-to-analog (DAC) converter. The measurement unit 130 reads the electrical potential of the conductive plate transmitted by the noncontact electrometer 120, and passes the electrical potential of the conductive plate transmitted by the noncontact electrometer 120 to the voltage feedback circuit unit 140.

The voltage feedback circuit unit 140 feeds the electrical potential of the conductive plate passed by the measurement unit 130 back, and applies the electrical potential of the conductive plate to a terminal of a relay switch, thereby causing an electric current to become zero (0). Thus, it is possible to minimize influence of a stray capacitor even after the relay switch is switched off.

The charge plate monitor 100 having the construction described above includes a high voltage power supply (HVPS) provided in a plate assembly. Thus, the charge plate monitor 100 eliminates a stray capacitor in the relay switch by using the voltage feedback circuit unit 14. Therefore, it is unnecessary to use a high voltage cable and it is possible to maintain an equivalent capacitance (for example, capacitance of 20 pF±2 pF) by minimizing a stray capacitance. For this reason, it is possible to prevent the stray capacitance from influencing measurements such as a static decay time when application of a high voltage is switched on and off by the relay switch. Therefore, it is possible to precisely evaluate performance of an ionizer.

The charge plate monitor 100 having the construction described above can be used as a measurement device for measuring a static elimination performance of an industrial ionizer. The charge plate monitor 100 can precisely measure a decay time of an industrial ionizer by minimizing influence of a stray capacitor.

As to the charge plate monitor 100 having the construction described above, a high voltage application portion of the HVPS is combined with the measurement plate unit 110. This design reduces an overall size of the measurement unit 130 and simplifies the structure of the measurement plate unit 110. In addition, since the measurement unit 130 and the measurement plate unit 110 are connected by a signal line, it is easy to choose a cable for connection therebetween.

The charge plate monitor 100 having the construction described above detects an electrical potential of the conductive plate 111 using the noncontact electrometer 120 when applying a high voltage to the measurement plate unit 110 using the HVPS, and makes an electric current become zero (0) by using the voltage feedback circuit unit 140 that applies the detected electrical potential of the conductive plate to a terminal of the relay switch. Therefore, it is possible to prevent a stray capacitor influencing on measurements even after the relay switch is switched off. In addition, since it is possible to maintain an equivalent capacitance (for example, capacitance of 20 pF±2 pF) as the plate capacitance, influence of the stray capacitor on measurements such as a natural discharge time can be prevented.

The charge plate monitor 100 having the construction described above can be used to minimize influence of a stray capacitor in a circuit unit that applies a voltage by using a relay switch, or can be used for a product requiring a high insulation resistance.

Figure 3:
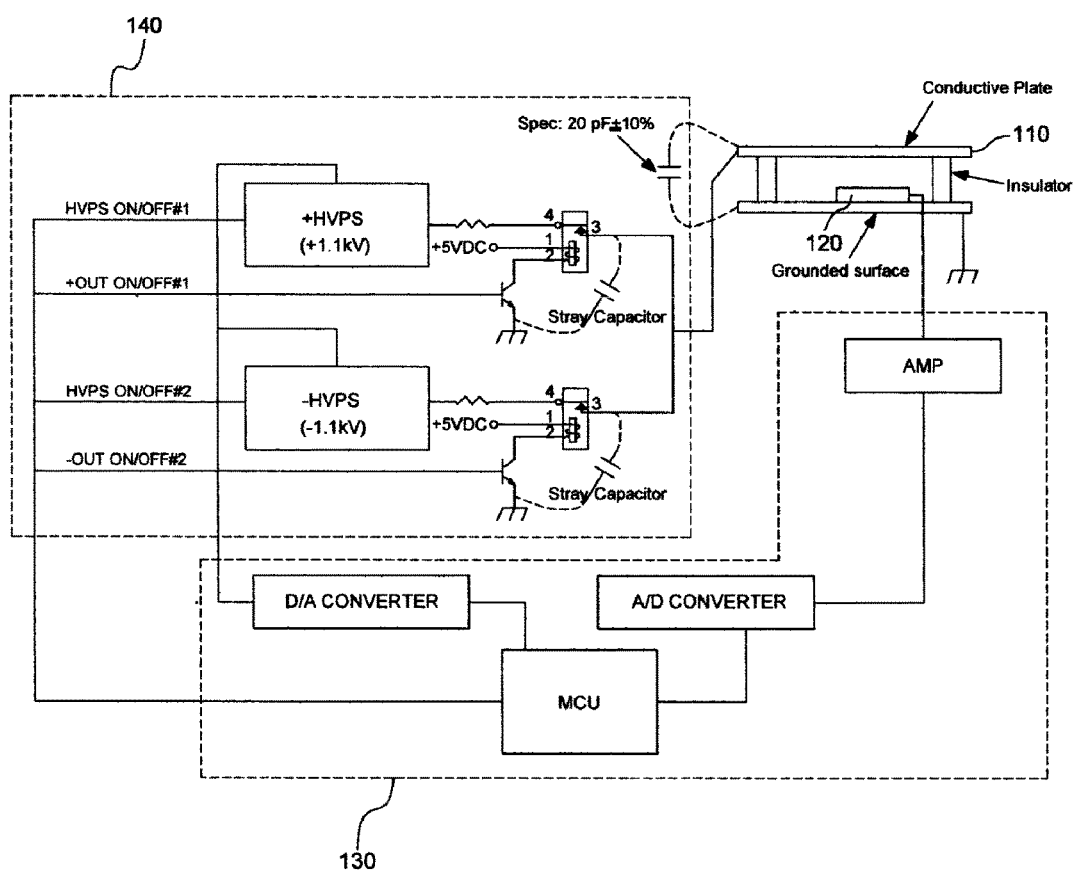
FIG. 3 is a diagram illustrating a voltage feedback circuit unit of FIG. 2.

FIG. 3 is a diagram illustrating the voltage feedback circuit unit of FIG. 2.

With reference to FIG. 3, in decay mode, a main controller (not illustrated) in the measurement unit 130 generates an HVPS on signal (for example, a plus HVPS on signal (HVPS ON #1) or a minus HVPS on signal (HVPS ON #2)), and a relay switch on signal (for example, a plus relay switch on signal (+OUT ON #1) or a minus relay switch on signal (−OUT ON #2)), transmits the generated HVPS on signal (for example, the plus HVPS on signal (HVPS ON #1) or the minus HVPS on signal (HVPS ON #2)) to the plus HVPS or the minus HVPS, and transmits the generated relay switch on signal (for example, the plus relay switch on signal (+OUT ON #1) or the minus relay switch on signal (−OUT ON #2)) to the plus relay switch or the minus relay switch.

The plus HVPS and the minus HVPS apply different voltages to the plus relay switch and the minus relay switch, respectively in accordance with the HVPS on signals (for example, the plus HVPS on signal (HVPS ON #1) and the minus HVPS on signal (HVPS ON #2)) transmitted by the main controller.

The plus relay switch or the minus relay switch is switched on in accordance with the relay switch on signal (for example, the plus relay switch on signal (+OUT ON #1) or the minus relay switch on signal (−OUT ON #2)) transmitted by the main controller, and charges the conductive plate to a voltage that is equal to or higher than a predetermined value (for example, 1050 V) by using the voltage supplied by the plus HVPS or the minus HVPS.

The noncontact electrometer 120 detects an electrical potential of the measurement plate unit 110 (conductive plate 111) and applies the detected electrical potential of the conductive plate to the measurement unit 130. Specifically, when the voltage supplied by the plus HVPS or the minus HVPS is equal to or higher than a predetermined value (for example, 1050 V), the noncontact electrometer 120 transmits the electrical potential of the conductive plate to the measurement unit.

Meanwhile, when the voltages supplied by the plus HVPS and the minus HVPS are equal to or higher than a predetermined value (for example, 1050 V), the main controller of the measurement unit 130 generates relay switch off signals (for example, a plus relay switch off signal (+OUT OFF #1) and a minus relay switch off signal (−OUT OFF #2)). Meanwhile, when the electrical potential of the conductive plate is equal to or lower than a predetermined value (for example, 100 V), the main controller of the measurement unit 130 generates HVPS off signals (for example, a plus HVPS off signal (HVPS OFF #1) and a minus HVPS off signal (HVPS OFF #2)) for switching off the voltage supply from the plus HVPS and the minus HVPS. In this case, the main controller of the measurement unit 130 transmits the generated relay switch off signals (for example, the plus relay switch off signal (+OUT OFF #1) and the minus relay switch off signal (−OUT OFF #2)) to the plus relay switch and the minus relay switch, respectively, and transmits and the generated HVPS off signals (for example, the plus HVPS off signal (HVPS OFF #1) and the minus HVPS off signal (HVPS OFF #2)) to the plus HVPS and minus HVPS, respectively.

The plus HVPS and the minus HVPS switch off the voltage supply to the plus relay switch and the minus relay switch in accordance with the HVPS off signals (for example, the plus HVPS off signal (HVPS OFF #1) and the minus HVPS off signal (HVPS OFF #2)).

The plus relay switch and the minus relay switch are switched off in accordance with the relay switch off signals (for example, the plus relay switch off signal (+OUT OFF #1) and the minus relay switch off signal (−OUT OFF #2)) transmitted by the main controller, thereby switching off the voltage supply from the plus HVPS and the minus HVPS.

The main controller of the measurement unit 130 reads the value of the electrical potential of the conductive plate detected by the noncontact electrometer 120 when the voltages supplied by the plus HVPS and the minus HVPS are equal to or higher than a predetermined value (for example, 1050 V), and feeds the read value of the electrical potential back via the voltage feedback circuit unit 140 until the read value of the electrical potential of the conductive plate drops to or below a predetermined value (for examples, 100 V). In this way, the electrical potentials at opposite ends of the relay switch are equalized by following the voltage supplied by the HVPS, so an electric current across the relay switch becomes nearly zero (0). In this way, it is possible to minimize influence of a stray capacitance even after the relay switch is switched off.

The present invention may not embodied only in the form of the device and/or operation method described above. The present invention can be implemented as a computer program for implementing functions corresponding to constituent elements of a specific embodiment, or a recording medium on which the program is recorded. Those skilled in the art can easily implement the present invention by referring to the description of the embodiments described above. Although preferred embodiments of the present invention have been described for illustrative purposes, the preferred embodiments are not intended to limit the scope of the present invention, and those ordinarily skilled in the art will appreciate that various modifications, additions and substitutions are possible, without departing from the scope and spirit of the present invention as disclosed in the accompanying claims.

The invention claimed is:

1. A charge plate monitor comprising:
   a measurement plate unit including a conductive plate, a ground surface, and an insulator provided between the conductive plate and the ground surface;
   a noncontact electrometer provided between the conductive plate and the ground surface of the measurement plate unit, which detects an electrical potential of the conductive plate;
   a measurement unit which reads or passes the electrical potential of the conductive plate detected by the noncontact electrometer; and
   a voltage feedback circuit unit which applies the electrical potential of the conductive plate passed by the measurement unit to a terminal of a relay switch by feeding the electrical potential of the conductive plate back,
   wherein the voltage feedback circuit unit makes an electric current zero (0) by applying the electrical potential of the conductive plate, which is detected by the noncontact electrometer, to the terminal of the relay switch, and equalizing electrical potentials at opposite ends of the relay switch, thereby preventing the measurement plate unit from being influenced by a stray capacitor even after the relay switch is switched off, and
   the charge plate monitoring apparatus further comprises a high voltage power supply (HVPS) having a power application portion that is combined with the measurement plate unit so as to be embedded together, wherein the HVPS supplies a voltage to the relay switch in accordance with an HVPS on signal applied by the measurement unit, and switches off the applied voltage to the relay switch in accordance with an HVPS off signal applied by the measurement unit.

2. The charge plate monitoring apparatus according to claim 1, wherein in decay mode, the measurement unit generates an HVPS on signal and a relay switch on signal, and transmits the HVPS on signal and the relay switch on signal to the HVPS and the relay switch, respectively.

3. The charge plate monitoring apparatus according to claim 2, wherein the measurement unit generates a relay switch off signal when a voltage supplied by the HVPS is equal to or higher than a predetermined value, generates an HVPS off signal when the voltage supplied by the HVPS is equal to or lower than a predetermined value, and transmits the HVPS off signal and the relay switch off signal to the HVPS and the relay switch, respectively.

4. A charge plate monitor comprising:
   a measurement plate unit including a conductive plate, a ground surface, and an insulator provided between the conductive plate and the ground surface;
   a noncontact electrometer provided between the conductive plate and the ground surface of the measurement plate unit, which detects an electrical potential of the conductive plate;
   a measurement unit which reads or passes the electrical potential of the conductive plate detected by the noncontact electrometer; and
   a voltage feedback circuit unit which applies the electrical potential of the conductive plate passed by the measurement unit to a terminal of a relay switch by feeding the electrical potential of the conductive plate back, and
   further comprising an HVPS having a voltage application portion combined with the measurement plate unit.

* * * * *